US011079639B2

(12) United States Patent
Cao

(10) Patent No.: US 11,079,639 B2
(45) Date of Patent: Aug. 3, 2021

(54) LIQUID CRYSTAL DISPLAY PANEL

(71) Applicant: Wuhan China Star Optoelectronics Technology Co., Ltd., Wuhan (CN)

(72) Inventor: Wu Cao, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/493,299

(22) PCT Filed: Jul. 29, 2019

(86) PCT No.: PCT/CN2019/098145
§ 371 (c)(1),
(2) Date: Sep. 12, 2019

(87) PCT Pub. No.: WO2020/042847
PCT Pub. Date: Mar. 5, 2020

(65) Prior Publication Data
US 2020/0201128 A1 Jun. 25, 2020

(30) Foreign Application Priority Data
Aug. 31, 2018 (CN) .......................... 201811012696.4

(51) Int. Cl.
*G02F 1/1362* (2006.01)
*H01L 27/12* (2006.01)
*H01L 29/786* (2006.01)

(52) U.S. Cl.
CPC .. *G02F 1/136209* (2013.01); *G02F 1/136213* (2013.01); *G02F 1/136286* (2013.01);
(Continued)

(58) Field of Classification Search
CPC ............ G02F 1/136209; G02F 1/1343; G02F 1/136222; G02F 1/133514; G02F 1/136286; H01L 29/78633; H01L 27/124
See application file for complete search history.

(56) References Cited

U.S. PATENT DOCUMENTS 6,281,960 B1 * 8/2001 Kishimoto ........ G02F 1/133377
349/110
2005/0117094 A1 6/2005 Kim et al.
(Continued)

FOREIGN PATENT DOCUMENTS

CN 100407022 7/2008
CN 101676783 3/2010
(Continued)

*Primary Examiner* — Vincent Wall

(57) ABSTRACT

A liquid crystal display panel is disclosed and includes: a substrate, a plurality of data lines and gate lines disposed on the substrate, the data lines intersecting the gate lines to form a plurality of pixel units each including a metal pattern layer, a color resist, and a gate electrode light shielding structure; the metal pattern layer disposed on the substrate; the color resist covering the metal pattern layer; the gate electrode light shielding structure disposed on the gate lines to shield a gap between adjacent pixel units, an edge of the gate electrode light shielding structure located in the color resist and retracting away from the color resist to form a retraction portion reducing an extent of the color resist edge overlapping the light shielding structure edge to prevent a blocking wall of the protruding gate electrode light shielding structure from being excessively high and affecting later processes.

3 Claims, 7 Drawing Sheets

(52) U.S. Cl.
CPC ........ *H01L 27/124* (2013.01); *H01L 27/1248* (2013.01); *H01L 27/1255* (2013.01); *H01L 29/78633* (2013.01); *G02F 1/136222* (2021.01)

(56) References Cited

U.S. PATENT DOCUMENTS

2007/0171337 A1   7/2007  Kim et al.
2010/0033646 A1   2/2010  Baek et al.

FOREIGN PATENT DOCUMENTS

| | | |
|---|---|---|
| CN | 101802659 | 8/2010 |
| CN | 101825814 | 9/2010 |
| CN | 103064218 | 4/2013 |
| CN | 104483790 | 4/2015 |
| CN | 104808411 | 7/2015 |
| CN | 106773393 | 5/2017 |
| JP | 2000-111724 | 4/2000 |
| JP | 2003-050387 | 2/2003 |

\* cited by examiner

LIQUID CRYSTAL DISPLAY PANEL

RELATED APPLICATIONS

This application is a National Phase of PCT Patent Application No. PCT/CN2019/098145 having International filing date of Jul. 29, 2019, which claims the benefit of priority of Chinese Patent Application No. 201811012696.4 filed on Aug. 31, 2018. The contents of the above applications are all incorporated by reference as if fully set forth herein in their entirety.

FIELD AND BACKGROUND OF THE INVENTION

The present invention relates to a liquid crystal display panel that is able to reduce a blocking wall effect of a gate electrode light shielding bar and prevent issues of decreased diffusibility of polyimide (PI) liquid and liquid crystals (LCs) or occurrence of alignment dark fringes.

In a structure of a black spacer (BPS) display panel among conventional liquid crystal display panels, a thickness of a film layer of a black spacer is large and is usually over 3 um. In a color filter on array (COA) substrate including black spacers, a topography of a substrate is more complicated with poor flatness. In a successive cell process, the complicated topography of such array substrate probably affects coating of the alignment liquid and diffusion of the liquid crystals.

With reference to FIGS. 1 and 2, the black spacer display panel includes a substrate 90. A plurality of data lines 91 and a plurality of gate lines 92 are disposed on the substrate 90, and the data lines 91 intersect the gate lines 92 to form a plurality of pixel units.

A first metal layer 941 and a second metal layer 942 stacked in each of the pixel units form storage capacitors (Cst) 94 of the pixel units. A color resist 93 is disposed in the pixel unit (FIG. 1 only illustrates a partial contour of a side of a color resist near a gate line), and an edge 931 of the color resist 93 covers and is disposed on the storage capacitor 94.

A gate electrode light shielding structure 95 is disposed on the gate lines 92 and is configured to shield a gap between adjacent two of the pixel units. An edge 951 of the gate electrode light shielding structure 95 is located in the color resist. With reference to a cross-sectional view in FIG. 2, because the color resist 93, the gate electrode light shielding structure 95, and the storage capacitor 94 are stacked on one another to form a greater step and even to form a horn 955, coating of alignment liquid and flow of liquid crystal in a later cell process will be influenced.

SUMMARY OF THE INVENTION

Technical Issue

Because that a color resist substrate of a conventional black spacer has a shortage of including a blocking wall effect disadvantaging a cell process, the present invention provides a liquid crystal display panel for reducing a blocking wall effect, which is able to lower a blocking wall effect of a gate electrode light shielding bar and prevent issues of lowered diffusibility of polyimide (PI) liquid and liquid crystals (LCs) or alignment dark fringes.

Technical Solution

A main objective of the present invention is to provide a liquid crystal display panel for lowering a blocking wall effect, comprising:

a substrate, a plurality of data lines and a plurality of gate lines disposed on the substrate, the data lines intersecting the gate lines to form a plurality of pixel units, each of the pixel units comprising a metal pattern layer, a color resist, and a gate electrode light shielding structure;

the metal pattern layer disposed on the substrate;

the color resist covering and disposed on the metal pattern layer; and the gate electrode light shielding structure disposed above the gate lines and configured to shield a gap between adjacent two of the pixel units, an edge of the gate electrode light shielding structure located in the color resist, and the gate electrode light shielding structure retracting along a direction away from the color resist to form a retraction portion.

In an embodiment of the present invention, each of the color resists comprises a color resist edge, the color resist edge is stacked on a portion of the metal pattern layer; and the gate electrode light shielding structure comprises a light shielding structure edge stacked on the color resist edge, the retraction portion is formed on the light shielding structure edge and is located above the metal pattern layer.

In an embodiment of the present invention, the retraction portion of the gate electrode light shielding structure is stacked on the color resist edge of the color resist, and an overlapping width between the retraction portion of the gate electrode light shielding structure and the color resist edge of the color resist is less than an overlapping width of the light shielding structure edge of the gate electrode light shielding structure and the color resist edge of the color resist.

In an embodiment of the present invention, the gate electrode light shielding structure comprises a black spacer and/or a black matrix.

In an embodiment of the present invention, the color resist edge of the color resist comprises a first tapered portion, the retraction portion of the gate electrode light shielding structure comprises a second tapered portion, and the second tapered portion is stacked on the first tapered portion of the color resist.

In an embodiment of the present invention, the retraction portion of the gate electrode light shielding structure touches the color resist edge of the color resist without overlapping the color resist edge of the color resist.

In an embodiment of the present invention, the retraction portion of the gate electrode light shielding structure is at a distance from the color resist edge of the color resist without overlapping the color resist edge of the color resist.

In an embodiment of the present invention, the metal pattern layer comprises a first metal layer and a second metal layer stacked on the first metal layer, wherein the first metal layer and the second metal layer are configured to form an electrical element.

In an embodiment of the present invention, an area of the second metal layer of the metal pattern layer is greater than an area of the first metal layer, and the retraction portion of the gate electrode light shielding structure is located above the second metal layer without exceeding an edge of the second metal layer.

In an embodiment of the present invention, the electrical element is a storage capacitor.

Another objective of the present invention is to provide a liquid crystal display panel, comprising:

a substrate, a plurality of data lines and a plurality of gate lines disposed on the substrate, the data lines intersecting the gate lines to form a plurality of pixel units, each of the pixel units comprising a metal pattern layer, a color resist, and a gate electrode light shielding structure;

the metal pattern layer disposed on the substrate;

the color resist covering and disposed on the metal pattern layer; and the gate electrode light shielding structure disposed above the gate lines and configured to shield a gap between adjacent two of the pixel units, an edge of the gate electrode light shielding structure located in the color resist, and the gate electrode light shielding structure retracting along a direction away from the color resist to form a retraction portion;

wherein each of the color resists comprises a color resist edge, the color resist edge is stacked on a portion of the metal pattern layer; and the gate electrode light shielding structure comprises a light shielding structure edge stacked on the color resist edge, the retraction portion is formed on the light shielding structure edge and is located above the metal pattern layer;

wherein the retraction portion of the gate electrode light shielding structure touches the color resist edge of the color resist without overlapping the color resist edge of the color resist, or the retraction portion of the gate electrode light shielding structure is at a distance from the color resist edge of the color resist without overlapping the color resist edge of the color resist;

wherein the gate electrode light shielding structure comprises a black spacer and/or a black matrix.

In an embodiment of the present invention, the color resist edge of the color resist comprises a first tapered portion, the retraction portion of the gate electrode light shielding structure comprises a second tapered portion, and the second tapered portion is stacked on the first tapered portion of the color resist.

Another objective of the present invention is to provide a liquid crystal display panel, comprising:

a substrate, a plurality of data lines and a plurality of gate lines disposed on the substrate, the data lines intersecting the gate lines to form a plurality of pixel units, each of the pixel units comprising a metal pattern layer, a color resist, and a gate electrode light shielding structure;

the metal pattern layer disposed on the substrate;

the color resist covering and disposed on the metal pattern layer; and the gate electrode light shielding structure disposed above the gate lines and configured to shield a gap between adjacent two of the pixel units, an edge of the gate electrode light shielding structure located in the color resist, and the gate electrode light shielding structure retracting along a direction away from the color resist to form a retraction portion;

wherein each of the color resists comprises a color resist edge, the color resist edge is stacked on a portion of the metal pattern layer; and the gate electrode light shielding structure comprises a light shielding structure edge stacked on the color resist edge, the retraction portion is formed on the light shielding structure edge and is located above the metal pattern layer;

wherein the retraction portion of the gate electrode light shielding structure touches the color resist edge of the color resist without overlapping the color resist edge of the color resist, or the retraction portion of the gate electrode light shielding structure is at a distance from the color resist edge of the color resist without overlapping the color resist edge of the color resist;

wherein the gate electrode light shielding structure comprises a black spacer and/or a black matrix.

In an embodiment of the present invention, the metal pattern layer comprises a first metal layer and a second metal layer stacked on the first metal layer, wherein the first metal layer and the second metal layer are configured to form an electrical element.

In an embodiment of the present invention, an area of the second metal layer of the metal pattern layer is greater than an area of the first metal layer, and the retraction portion of the gate electrode light shielding structure is located above the second metal layer without exceeding an edge of the second metal layer.

Advantages

Compared to the prior art, the present invention has the following advantages. The gate electrode light shielding structure corresponding to the gate line forms the retraction portion on the metal pattern layer to lower a thickness of a stacked portion of the gate electrode light shielding structure, the metal pattern layer, and the color resist, or alternatively, the retraction portion is not stacked on the color resist such that a thickness of the blocking wall of the gate electrode light shielding structure formed on the stacked portion thereof is reduced effectively to flatten the topography of the stacked portion. Accordingly, liquidity and diffusibility of the PI liquid and LCs are improved to prevent dark fringes or light leakage of the display panel.

To make the above description of the present invention to be better understood, preferred embodiments are described in details with accompanying drawings as follows.

DESCRIPTION OF SPECIFIC EMBODIMENTS OF THE INVENTION

Figure 1:
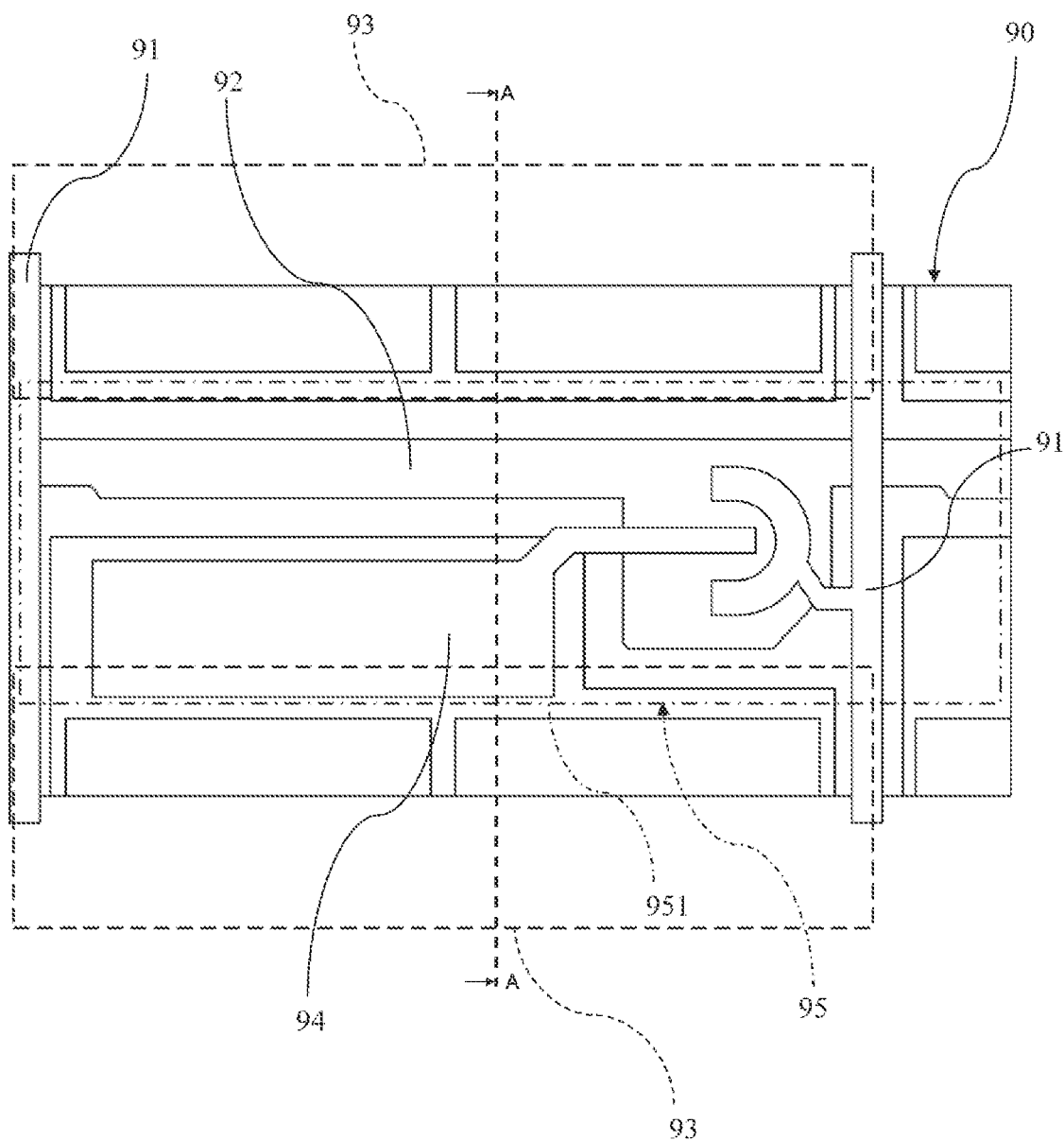
FIG. 1 is a partially enlarged top view of a conventional liquid crystal display panel, and FIG. 1 only illustrates a partial contour of a side of a color resist near a gate line.
Figure 2:
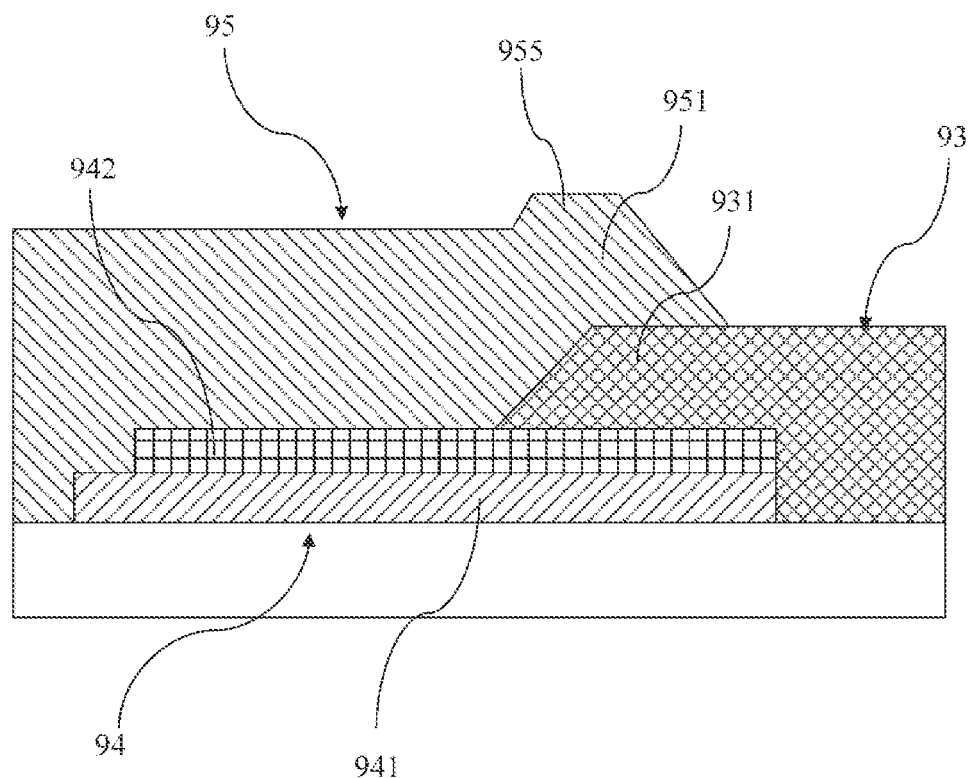
FIG. 2 is a cross-sectional side view of a partial region along line A-A in FIG. 1.
Figure 3:
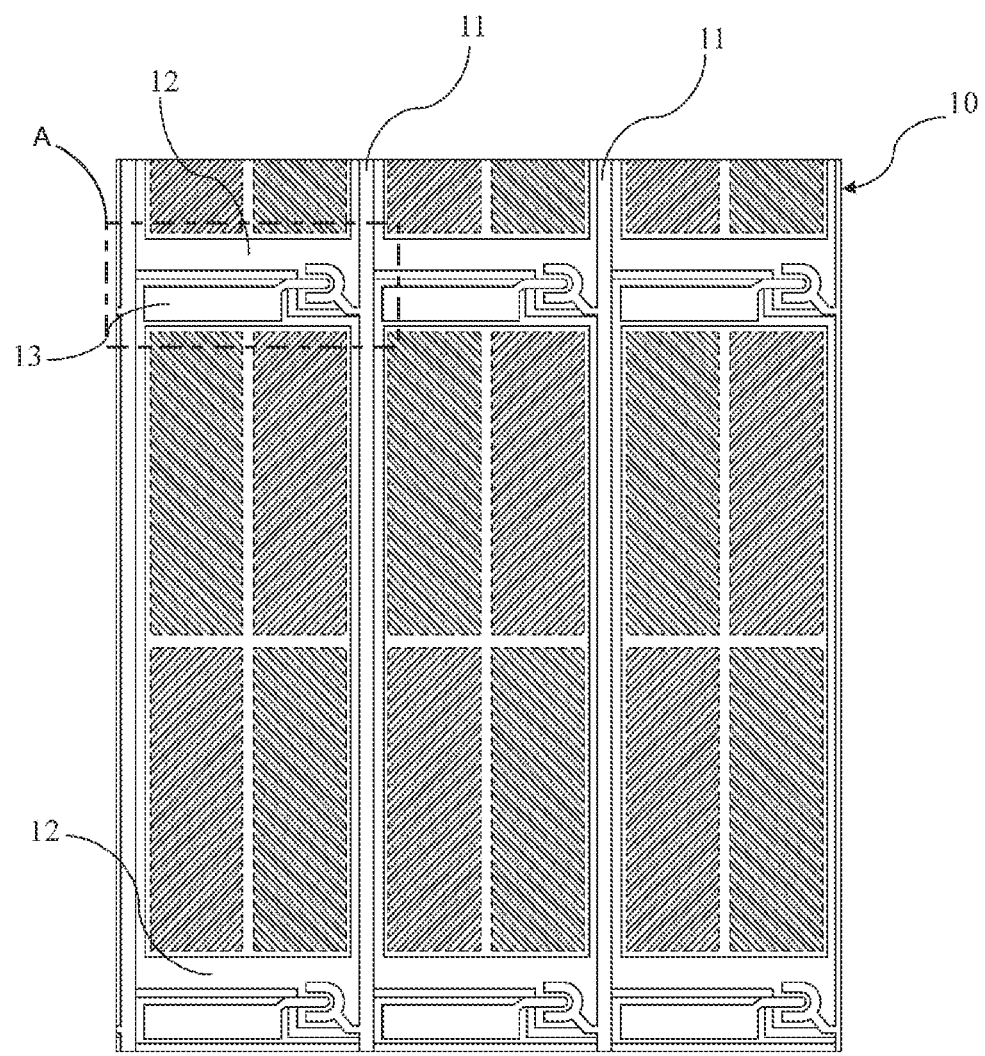
FIG. 3 is a partially enlarged top view of a first embodiment of a liquid crystal display panel of the present invention.
Figure 4:
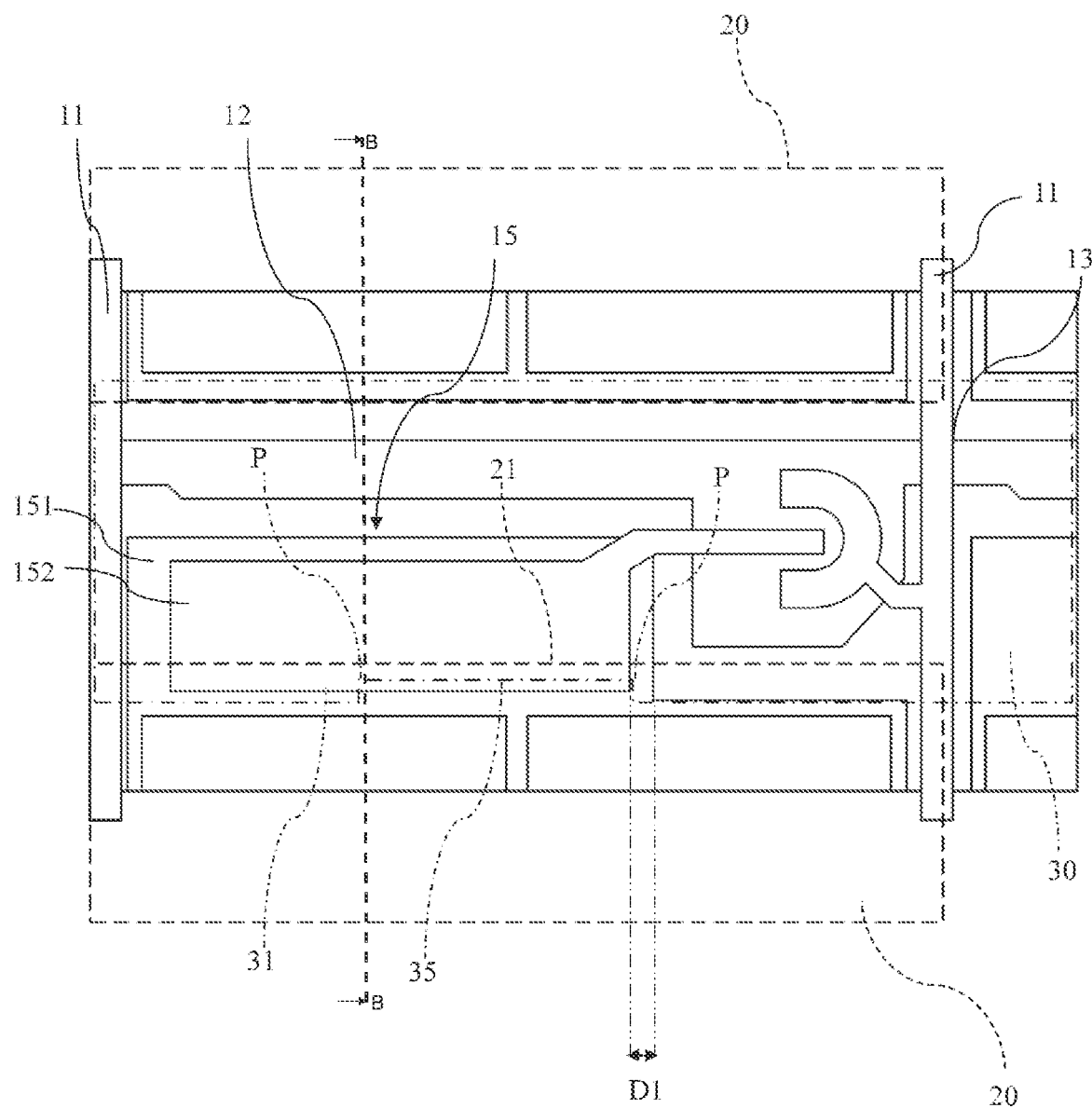
FIG. 4 is a partially enlarged view of a rectangular region A in FIG. 3, and FIG. 4 only illustrates a contour of a side of the color resist near the gate line.

With reference to FIGS. 3 and 4, a first embodiment of a liquid crystal display panel for reducing a blocking wall effect of the present invention comprises a substrate 10. A plurality of data lines 11 and a plurality of gate lines 12 are disposed on the substrate 10. The data lines 11 intersect the gate lines 12 to form a plurality of pixel units 13. Each of the pixel units 13 comprises a metal pattern layer 15, a color resist 20, and a gate electrode light shielding structure.

The metal pattern layer 15 is disposed on the substrate 10. The color resist 20 covers and is disposed on the metal pattern layer 15. The gate electrode light shielding structure is disposed on the gate lines 12 and is configured to block a gap between adjacent two of the pixel units 13. An edge of the gate electrode light shielding structure is located in the color resist 20. The gate electrode light shielding structure retracts along a direction away from the color resist 20 to form retraction portion 35.

The metal pattern layer 15 comprises a first metal layer 151 and a second metal layer 152 stacked on the first metal layer 151. The first metal layer 151 and the second metal layer 152 are configured to form an electrical element, for example a storage capacitor.

Figure 5:
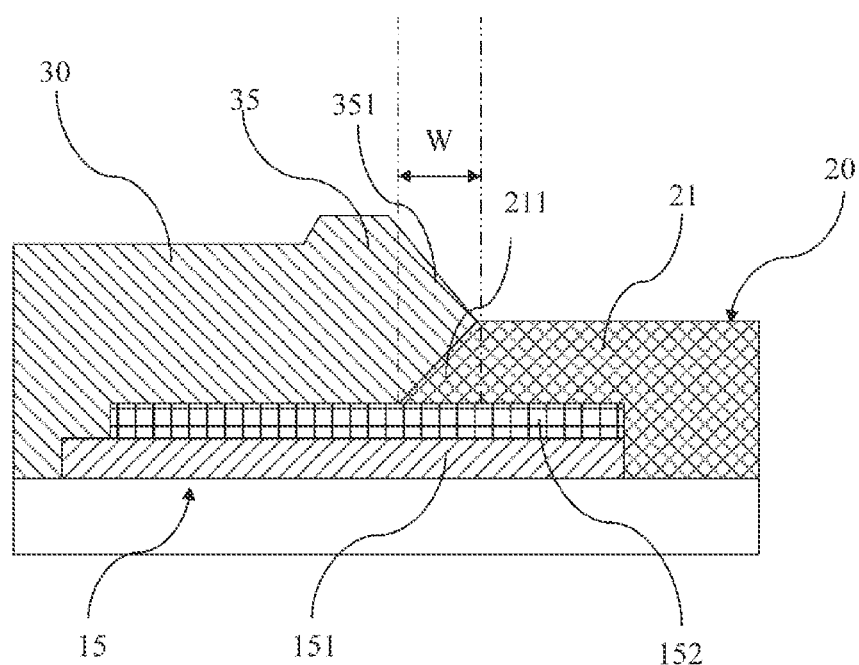
FIG. 5 is a cross-sectional side view of a retraction portion of the gate electrode light shielding structure in along line B-B FIG. 4.

With reference to FIG. 5, the color resist 20 comprises a color resist edge 21. The color resist edge 21 is stacked on a portion of the metal pattern layer 15. The gate electrode light shielding structure 30 comprises a light shielding structure edge 31 stacked on the color resist edge 21. The retraction portion 35 is formed on the light shielding structure edge 31 and is located above the metal pattern layer. The retraction portion 35 can be rectangular. The color resist edge 21 of the color resist 20 comprises a first tapered portion 211 that is located on an inner side of the color resist edge 21 as shown in FIG. 5. A thickness of the first tapered portion 211 gradually decreases along a direction toward an inner side edge of the color resist 20.

Preferably, a retracting distance of the retraction portion 35 of the gate electrode light shielding structure 30 relative to the light shielding structure edge 31 is less than or equal to 3 um. Preferably, a minimum distance D1 between a turning point P of the retraction portion 35 of the gate electrode light shielding structure 30 and a nearest edge of the metal pattern layer 15 is equal to or greater than 2 um, as shown in FIG. 4. The setting of the minimum distance D1 ensures that the gate electrode light shielding structure 30 would not shield regions other than the metal pattern layer 15 to inadvertently cover the light-emitting region of the liquid crystal display panel.

In the first embodiment of the present invention, the retraction portion 35 of the gate electrode light shielding structure 30 is stacked on the color resist edge 21 of the color resist 20, and an overlapping width W of the retraction portion 35 of the gate electrode light shielding structure 30 and the color resist edge 21 of the color resist 20 is less than an overlapping width of the light shielding structure edge 31 of the gate electrode light shielding structure 30 and the color resist edge 21 of the color resist 20, as shown in FIG. 5.

Preferably, the retraction portion 35 of the gate electrode light shielding structure 30 comprises a second tapered portion 351, the second tapered portion 351 is stacked on the first tapered portion 211 of the color resist 20, as shown in FIG. 5. A thickness of the second tapered portion 351 gradually decreases along a direction toward an inner side edge of the gate electrode light shielding structure 30.

Preferably, an area of the second metal layer 152 of the metal pattern layer 15 is greater than an area of the first metal layer 151, and the retraction portion 35 of the gate electrode light shielding structure 30 is located above the second metal layer 152 without exceeding an edge of the second metal layer 152.

Figure 6:
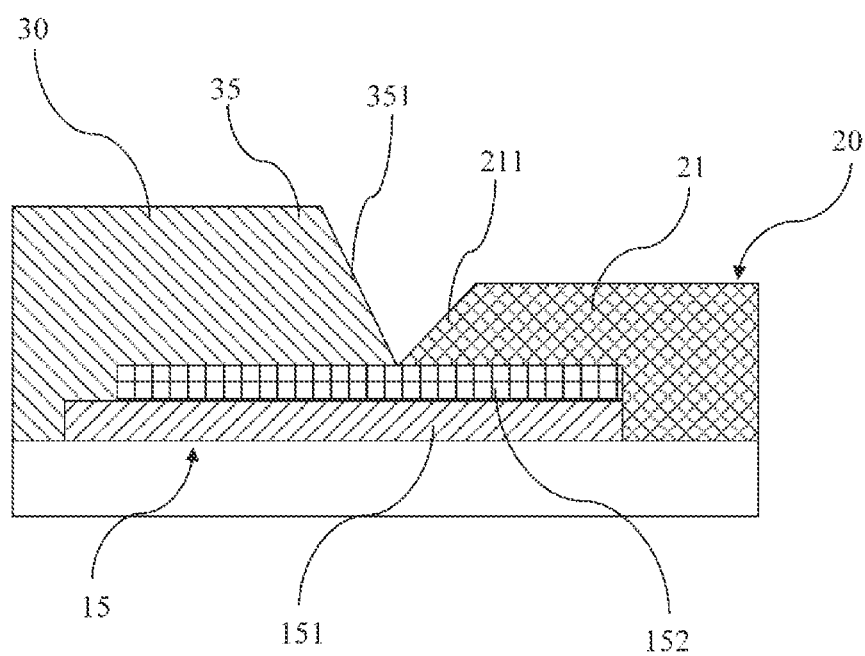
FIG. 6 is a cross-sectional side view of a retraction portion of the gate electrode light shielding structure of a second embodiment of a liquid crystal display panel of the present invention along line B-B in FIG. 4.

With reference to FIG. 6, a second embodiment of the liquid crystal display panel for reducing a blocking wall effect of the present invention is similar to the first embodiment and a difference thereof is that in the second embodiment the retraction portion 35 of the gate electrode light shielding structure 30 touches the color resist edge 21 of the color resist 20 without overlapping the color resist edge 21 of the color resist 20.

Figure 7:
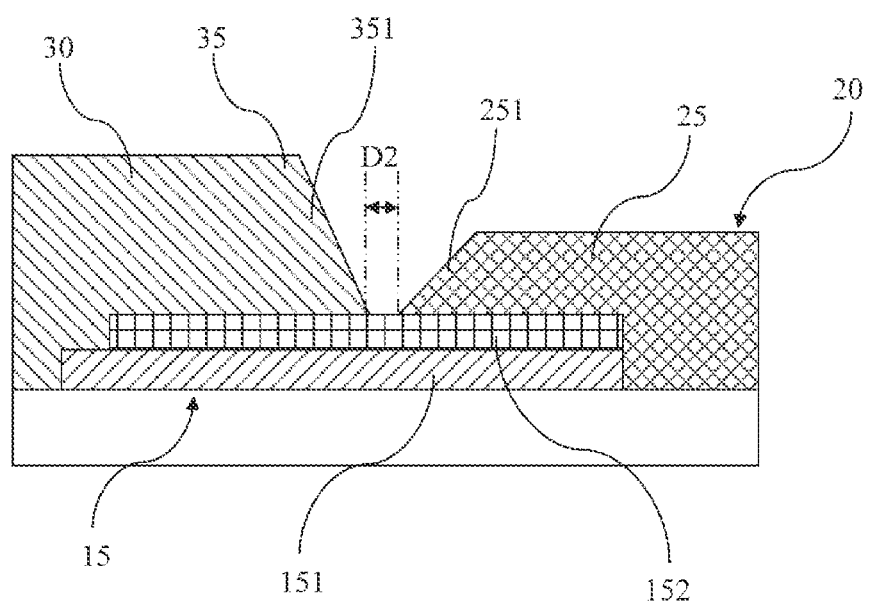
FIG. 7 is a cross-sectional side view of a retraction portion of the gate electrode light shielding structure of a third embodiment of a liquid crystal display panel of the present invention along line B-B in FIG. 4.

With reference to FIG. 7, a third embodiment of the liquid crystal display panel for reducing a blocking wall effect of the present invention is similar to the first embodiment and a difference thereof is that in the third embodiment the retraction portion 35 of the gate electrode light shielding structure 30 is at a distance D2 from the color resist edge 21 of the color resist 20 without overlapping the color resist edge 21 of the color resist 20. The distance D2 is less than or equal to 1 um.

Compared to the prior art, the present invention has advantages as follows. The gate electrode light shielding structure 30 corresponding to the gate electrode light shielding bar 3 of the gate lines 12 forms the retraction portion 35 on the metal pattern layer 15, to lower a thickness of a stacked portion of the gate electrode light shielding structure 30, the metal pattern layer 15, and the color resist 20 (first embodiment), or alternatively, the retraction portion 35 is not stacked on the color resist 20 (the second embodiment and third embodiment) such that a thickness of the blocking wall of the gate electrode light shielding structure 30 formed on the stacked portion thereof is reduced effectively to flatten the topography of the stacked portion. Accordingly, liquidity and diffusibility of the PI liquid and LCs are improved to prevent dark fringes or light leakage of the display panel.

What is claimed is:
1. A liquid crystal display panel, comprising:
a substrate, a plurality of data lines and a plurality of gate lines disposed on the substrate, the data lines intersecting the gate lines to form a plurality of pixel units, each of the pixel units comprising a metal pattern layer, a color resist, and a gate electrode light shielding structure;
the metal pattern layer disposed on the substrate;
the color resist covering and disposed on the metal pattern layer; and
the gate electrode light shielding structure disposed above the gate lines and configured to shield a gap between adjacent two of the pixel units, an edge of the gate electrode light shielding structure located in the color resist, and a portion of the edge of the gate electrode light shielding structure retracting along a direction away from the color resist to form a retraction portion that is a recessed region comprising two opposite side edges connected to the edge, a rear edge connected between the side edges and located at an interval from the edge, and a recessed region being hollow and defined among the side edges and the rear edge;
wherein each of the color resists comprises a color resist edge, the color resist edge is stacked on a portion of the metal pattern layer; and the gate electrode light shielding structure comprises a light shielding structure edge stacked on the color resist edge, the retraction portion is formed on the light shielding structure edge and is located above the metal pattern layer;
wherein the retraction portion of the gate electrode light shielding structure touches the color resist edge of the color resist without overlapping the color resist edge of the color resist, or the retraction portion of the gate electrode light shielding structure is at a distance from the color resist edge of the color resist without overlapping the color resist edge of the color resist;

wherein the gate electrode light shielding structure comprises a black spacer and/or a black matrix.

2. The liquid crystal display panel as claimed in claim 1, wherein the metal pattern layer comprises a first metal layer and a second metal layer stacked on the first metal layer, wherein the first metal layer and the second metal layer are configured to form an electrical element.

3. The liquid crystal display panel as claimed in claim 2, wherein an area of the second metal layer of the metal pattern layer is greater than an area of the first metal layer, and the retraction portion of the gate electrode light shielding structure is located above the second metal layer without exceeding an edge of the second metal layer.

* * * * *